(12) United States Patent
Lippincott et al.

(10) Patent No.: US 9,811,615 B2
(45) Date of Patent: Nov. 7, 2017

(54) SIMULTANEOUS RETARGETING OF LAYOUT FEATURES BASED ON PROCESS WINDOW SIMULATION

(71) Applicant: Mentor Graphics Corporation, Wilsonville, OR (US)

(72) Inventors: George P. Lippincott, Lake Oswego, OR (US); Zhitang Yu, Pleasanton, CA (US); Xima Zhang, Pleasanton, CA (US)

(73) Assignee: Mentor Graphics Corporation, Wilsonville, OR (US)

( * ) Notice: Subject to any disclaimer, the term of this patent is extended or adjusted under 35 U.S.C. 154(b) by 76 days.

(21) Appl. No.: 14/918,266

(22) Filed: Oct. 20, 2015

(65) Prior Publication Data

US 2017/0109459 A1     Apr. 20, 2017

(51) Int. Cl.
*G06F 17/50* (2006.01)
*G03F 1/36* (2012.01)

(52) U.S. Cl.
CPC ............ *G06F 17/5009* (2013.01); *G03F 1/36* (2013.01); *G06F 17/5072* (2013.01)

(58) Field of Classification Search
CPC ....................................................... G06F 17/50
USPC ........................................................... 716/53
See application file for complete search history.

(56) References Cited

U.S. PATENT DOCUMENTS

| 8,533,637 B2 | 9/2013 | Lippincott et al. |
| 2005/0273733 A1* | 12/2005 | Lippincott ................ G03F 1/36 716/52 |
| 2010/0122231 A1* | 5/2010 | Agarwal ................... G03F 1/36 716/53 |

* cited by examiner

*Primary Examiner* — Thuan Do
(74) *Attorney, Agent, or Firm* — Klarquist Sparkman, LLP

(57) ABSTRACT

Various aspects of the disclosed technology relate to techniques of retargeting layout features. A process window simulation on a layout design is performed to generate process window information that comprises predicted print positions of layout features computed under various process conditions. Retargeted print positions for a plurality of edge fragments in the layout design are then determined based on minimizing a combined change of targeted print positions for the plurality of edge fragments under constraints represented based on the process window information and specification limits for printed layout features. Based on the retargeted print positions, positions of the plurality of edge fragments are adjusted for optical proximity correction.

20 Claims, 6 Drawing Sheets

Flow chart
500

Flow chart
500

SIMULTANEOUS RETARGETING OF LAYOUT FEATURES BASED ON PROCESS WINDOW SIMULATION

FIELD OF THE DISCLOSED TECHNOLOGY

The present disclosed technology relates to photolithographic processing. Various aspects of the disclosed technology may be particularly useful for retargeting layout features based on process window simulations.

BACKGROUND OF THE DISCLOSED TECHNOLOGY

Electronic circuits, such as integrated circuits (ICs), are used in a variety of products, from automobiles to microwaves to personal computers. Designing and fabricating IC devices typically involves many steps, sometimes referred to as the "design flow." The particular steps of a design flow often are dependent upon the type of the circuit, its complexity, the design team, and the circuit fabricator or foundry that will manufacture the circuit. Typically, software and hardware "tools" verify the design at various stages of the design flow by running software simulators and/or hardware emulators. These steps aid in the discovery of errors in the design, and allow the designers and engineers to correct or otherwise improve the design.

Several steps are common to most design flows. Initially, the specification for a new circuit is transformed into a logical design, such as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logic of the circuit is then analyzed, to confirm that it will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. The relationships between the electronic devices are then analyzed, to confirm that the circuit described by the device design will correctly perform the desired functions. This analysis is sometimes referred to as "formal verification." Additionally, preliminary timing estimates for portions of the circuit are often made at this stage, using an assumed characteristic speed for each device, and incorporated into the verification process.

Once the components and their interconnections are established, the design is again transformed, this time into a physical design that describes specific geometric elements. This type of design often is referred to as a "layout" design. The geometric elements, which typically are polygons, define the shapes that will be created in various layers of material to manufacture the circuit. Typically, a designer will select groups of geometric elements representing IC components (e.g., contacts, channels, gates, etc.) and place them in a design area. These groups of geometric elements may be custom designed, selected from a library of previously-created designs, or some combination of both. Lines are then routed between the geometric elements, which will form the wiring used to interconnect the electronic devices. Layout tools (often referred to as "place and route" tools), such as Mentor Graphics' IC Station or Cadence's Virtuoso, are commonly used for both of these tasks.

Circuit layout descriptions can be provided in many different formats. The Graphic Data System II (GDSII) format is a popular format for transferring and archiving two-dimensional (2D) graphical circuit layout data. Among other features, it contains a hierarchy of structures, each structure containing layout elements (e.g., polygons, paths or poly-lines, circles and textboxes). Other formats include an open source format named Open Access, Milkyway by Synopsys, Inc., EDDM by Mentor Graphics, Inc., and the more recent Open Artwork System Interchange Standard (OASIS) proposed by Semiconductor Equipment and Materials International (SEMI). These various industry formats are used to define the geometrical information in design layouts that are employed to manufacture integrated circuits. Once the design is finalized, the layout portion of the design can be used by fabrication tools to manufacture the circuit using a photolithographic process.

There are many different fabrication processes for manufacturing a circuit, but most processes include a series of steps that deposit layers of different materials on a substrate, expose specific portions of each layer to radiation, and then etch the exposed (or non-exposed) portions of the layer away. For example, a simple semiconductor device component could be manufactured by the following steps. First, a positive type epitaxial layer is grown on a silicon substrate through chemical vapor deposition. Next, a nitride layer is deposited over the epitaxial layer. Then specific areas of the nitride layer are exposed to radiation, and the exposed areas are etched away, leaving behind exposed areas on the epitaxial layer, (i.e., areas no longer covered by the nitride layer). The exposed areas then are subjected to a diffusion or ion implantation process, causing dopants, for example phosphorus, to enter the exposed epitaxial layer and form charged wells. This process of depositing layers of material on the substrate or subsequent material layers, and then exposing specific patterns to radiation, etching, and dopants or other diffusion materials, is repeated a number of times, allowing the different physical layers of the circuit to be manufactured.

Each time that a layer of material is exposed to radiation, a mask must be created to expose only the desired areas to the radiation, and to protect the other areas from exposure. The mask is created from circuit layout data. That is, the geometric elements described in a design layout define the relative locations or areas of the circuit that will be exposed to radiation through the mask. A mask or reticle writing tool is used to create the mask based upon the design layout, after which the mask can be used in a photolithographic process.

As designers and manufacturers continue to increase the number of circuit components in a given area and/or shrink the size of circuit components, the shapes reproduced on the substrate (and thus the shapes in the mask) become smaller and are placed closer together. This reduction in feature size increases the difficulty of faithfully reproducing the image intended by the design layout onto the substrate. The diffractive effects of light often result in defects where the intended image is not accurately "printed" onto the substrate during the photolithographic process, creating flaws in the manufactured device. One or more resolution enhancement techniques (RETs) are often employed to improve the resolution of the image that the mask forms on the substrate during the photolithographic process. Examples of various resolution enhancement techniques are discussed in "Resolution Enhancement Technology: The Past, the Present, and Extensions for the Future," Frank M. Schellenberg, Optical Microlithography XVII, edited by Bruce W. Smith, Proceedings of SPIE Vol. 5377, which article is incorporated entirely herein by reference. One of these techniques, "optical proximity correction" or "optical process correction" (OPC), adjusts the amplitude of the light transmitted through a lithographic mask by modifying the design layout data employed to create the mask.

In a conventional OPC process, the edges of the geometric elements in the design are fragmented. For example, as shown in FIG. 3A, an edge of the geometric element 301 used to create a mask feature 300 may be fragmented into edge fragments 301A-301F, shown in FIG. 3B. The size of the edge fragments in a given layout design depends upon the OPC process parameters, often referred to as the OPC recipe. The "recipe" specifies the size of the edge fragments. While not all edges within a layout design are fragmented in every OPC process, these edges may also be referred to as edge fragments.

The model-based OPC process also simulates the printed image. That is, the photolithographic process is simulated in order to produce a simulated printed image (referred to as simulated image), such as the example image 302 shown in FIG. 3A. This simulated image is compared to the target image. Typically, this comparison is done at each edge fragment. For example, as shown in FIG. 3C, the target image is a distance d1 away from the simulated image at the edge fragment 301A, the target image is a distance d2 away from the simulated image at the edge fragment 301C, while the target image intersects the simulated image at the edge fragment 301B. The distances between the target image and the simulated image are often referred to as the edge placement error (EPE). Accordingly, in most conventional model-based OPC processes each edge fragment or unfragmented edge has an associated edge placement error (also referred to as an associated edge placement error value).

Next, the edge fragments are individually moved or adjusted in order to enable the simulated image for the resulting mask to reproduce the target image as much as possible. For example, as shown in FIG. 3D, the edge fragment 301A is displaced in a direction away from the geometric element 301, in an effort to widen the corresponding portion of the image that would be produced by the resulting mask. Similarly, the edge fragment 301C is displaced in a direction toward from the geometric element 301, in an effort to narrow the corresponding portion of the image that would be produced by the resulting mask. Next, the image that would be produced by a mask using the displaced edge fragments is simulated, and the new simulated image is compared with the target image, and the edge placement error for each edge fragment is computed.

This process of moving the edge fragments, simulating the image that would be produced using the moved edge fragments, and comparing the simulated image to the target image may be repeated a number of times. Each cycle of moving edge fragments and comparing the new simulated image to target image is referred to as an iteration of the OPC process. Typically, edge fragments moved during a given iteration, and the distance the edge fragments are displaced, are determined based upon the edge placement error. For example, because d1 is larger than d2 in FIG. 3C, a subsequent iteration of the optical proximity correction process may move edge fragment 301A a greater amount than edge fragment 301C.

The movement value for each edge fragment may be the edge placement error multiplied by a constant factor (feedback factor). This feedback factor may be location dependent or edge type dependent based on the OPC recipe. Methods that consider correlations between neighboring edge fragments such as those described in U.S. patent Ser. Nos. 14/183,209 and 14/183,228, which are incorporated herein by reference, may also be employed to derive the movement value (referred to as cross-MEEF (mask error enhancement factor)-based methods).

The OPC iteration process continues until the simulated image is sufficiently similar to the target image (e.g., both d1 and d2 are smaller than a threshold value), or until it is determined that the displacements of the edge fragments already have converged on locations where no further movement of the edge fragments will improve the simulated image. Once the final positions of the edge fragments are determined in the layout design data, as shown in FIG. 3D, a modified mask feature 303 can be created from the corrected layout design data. As shown in FIG. 3D, the image 304 produced by the modified mask feature 303 should more closely correspond to the target image.

In addition to proximity effects, process variations (or process errors) must also be considered to achieve high lithographic quality. There are a very large number of potential process errors in the semiconductor fabrication plant, from variations in the wafer filmstack to batch-to-batch variations in resist properties, from scanner stage vibrations to PEB (post-exposure bake) hot plate temperature nonuniformities. Most errors in the fabrication plant may be classified into two basic categories: errors that behave like dose errors (referred to as dose errors hereafter) and errors that behave like focus errors (referred to as focus errors hereafter). Engineers also define a third category of process errors, called masking sizing errors. Mask sizing errors arise from the fact that masks are exposed progressively in small sections and process conditions may change during the exposure process. Other process errors may need to be considered include errors associated with resist top-loss and with etching effects. Any of the above process condition variations can affect lithographic quality.

The term "process window" is often used to characterize how the lithographic process responds to changes in process conditions such as focus and doses. A process window may be defined as a window made by plotting contours that correspond to various specification limits as a function of process variations. One common process window, called the CD process window, is a contour plot of the high and low critical dimension (CD) specifications as a function of dose and focus variations. Here, the term CD, also called the linewidth or feature width, refers to the size (width) of a feature printed in resist, measured at a specific height above the substrate. The contour plot form of data visualization is useful for establishing the limits of exposure and focus that allow the printed image to meet certain specifications. Another form often used for visualizing the impact of process variations is the process variability (PV) band. The PV band defines the region of edge placement uncertainty when the layout design is subject to process variations. It is plotted as a band along the edges of layout features. The larger the process variation, the wider the PV band. The PV band may be derived using the process window simulation which simulates process variations.

A layout design may have regions with printability problems that are caused by process variations unavoidable in the fabrication plant. These regions are lithography hotspots or litho hotspots. Litho hotspots may be corrected by modifying layout designs in such a manner as to cause a change in the final printed contours. For example, pinching hotspots require an increase of the width of a printed contour subject to pinching while bridging hotspots requires an increase of the spacing between two printed contours subject to bridging. This layout modification procedure is often referred to as retargeting as the original drawn target of layout features is changed. Retargeting can be performed by either designers or manufacturers. As for the latter, retargeting is usually performed along with OPC and with the help of process window simulations. Sometimes the edge placement error calculated based on the retargeted print position is referred to as the "effective" edge placement error. Retargeting one edge fragment may affect other edge fragments. Moreover, OPC and process window simulations are computationally demanding. It is thus desirable to develop efficient methods for retargeting.

BRIEF SUMMARY OF THE DISCLOSED TECHNOLOGY

Various aspects of the disclosed technology relate to techniques of retargeting layout features based on process window simulation. In one aspect, there is a method comprising: performing a process window simulation on a layout design to generate process window information, the layout design corresponding to at least a portion of an integrated circuit, the process window information comprising predicted print positions of layout features computed under various process conditions; determining retargeted print positions for a plurality of edge fragments in the layout design based on minimizing a combined change of targeted print positions for the plurality of edge fragments under constraints on changes of the targeted print positions for the plurality of edge fragments, the constraints being represented based on the process window information and specification limits for printed layout features; and adjusting positions of the plurality of edge fragments for optical proximity correction based on the retargeted print positions.

According to some embodiments of the disclosed technology, the method may further comprise repeating the performing, the determining and the adjusting operations.

The combined change of targeted positions may be a linear combination of the changes of or absolute values of the changes of the targeted print positions for the plurality of edge fragments. The linear combination of absolute values of the changes may be a sum of absolute values of the changes of the targeted print positions.

The process window information may comprise a PV (process variability) band, print images for individual layout features derived under user-specified process conditions, or both. The specification limits may comprise specification limits on line width, line spacing, enclosure, or any combination thereof In another aspect, there are one or more computer-readable media storing computer-executable instructions for causing one or more processors to perform the above method.

In still another method, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclosed technology. Thus, for example, those skilled in the art will recognize that the disclosed technology may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNOLOGY

Figure 1:
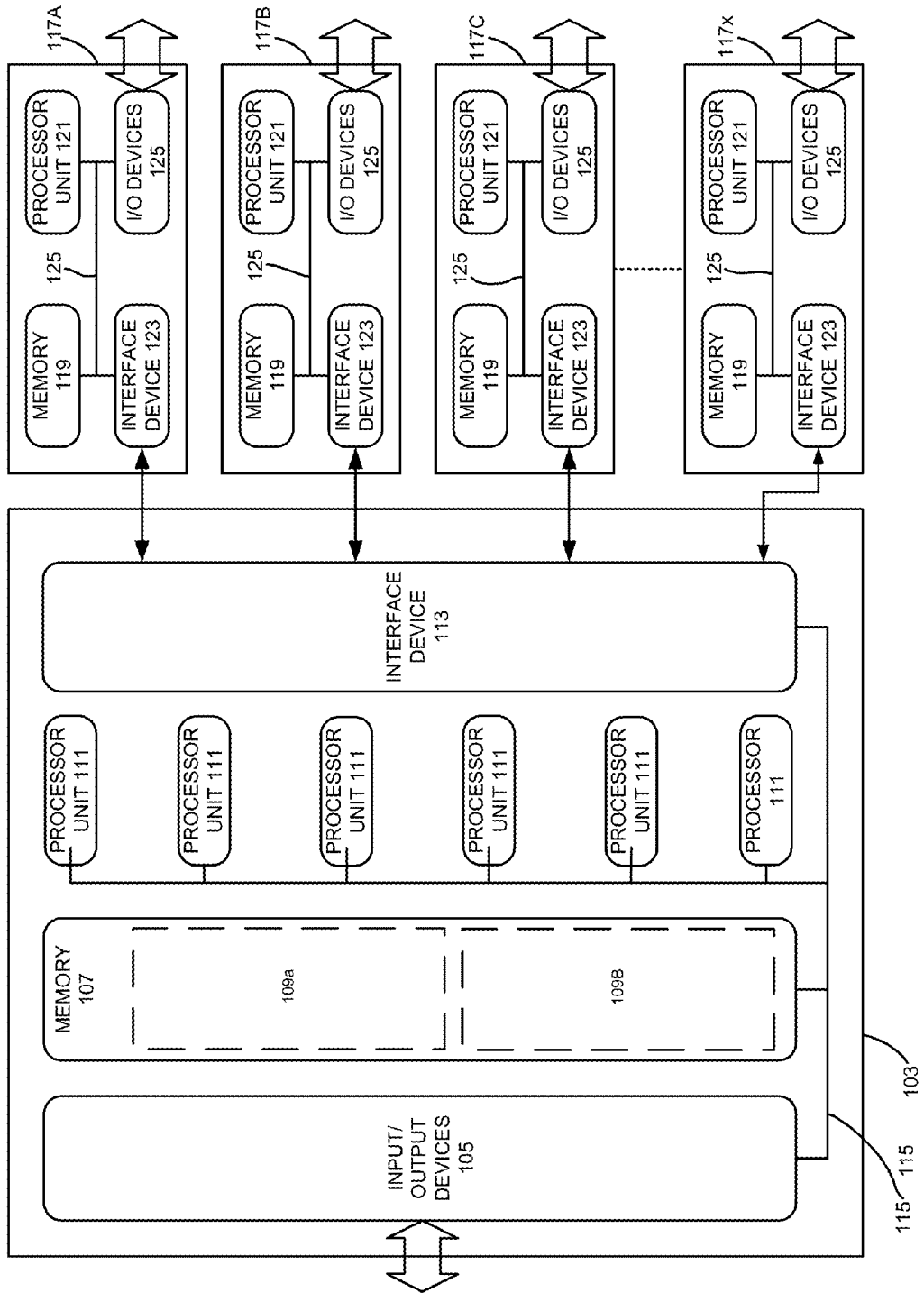
FIG. 1 illustrates an example of a computing system that may be used to implement various embodiments of the invention.

Various aspects of the present disclosed technology relate to retargeting layout features based on process window simulations. In the following description, numerous details are set forth for the purpose of explanation. However, one of ordinary skill in the art will realize that the disclosed technology may be practiced without the use of these specific details. In other instances, well-known features have not been described in details to avoid obscuring the present disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "perform" and "determine" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device. Still further, the term "design" also is intended to encompass data describing more than one microdevice, such as data to be used to form multiple microdevices on a single wafer.

Operating Environment

The execution of various electronic design automation processes according to embodiments of the disclosed technology may be implemented using computer-executable software instructions executed by one or more programmable computing devices. Because these embodiments of the disclosed technology may be implemented using software instructions, the components and operation of a generic programmable computer system on which various embodiments of the disclosed technology may be employed will first be described. Further, because of the complexity of some electronic design automation processes and the large size of many circuit designs, various electronic design automation tools are configured to operate on a computing system capable of concurrently running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the disclosed technology.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the disclosed technology. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
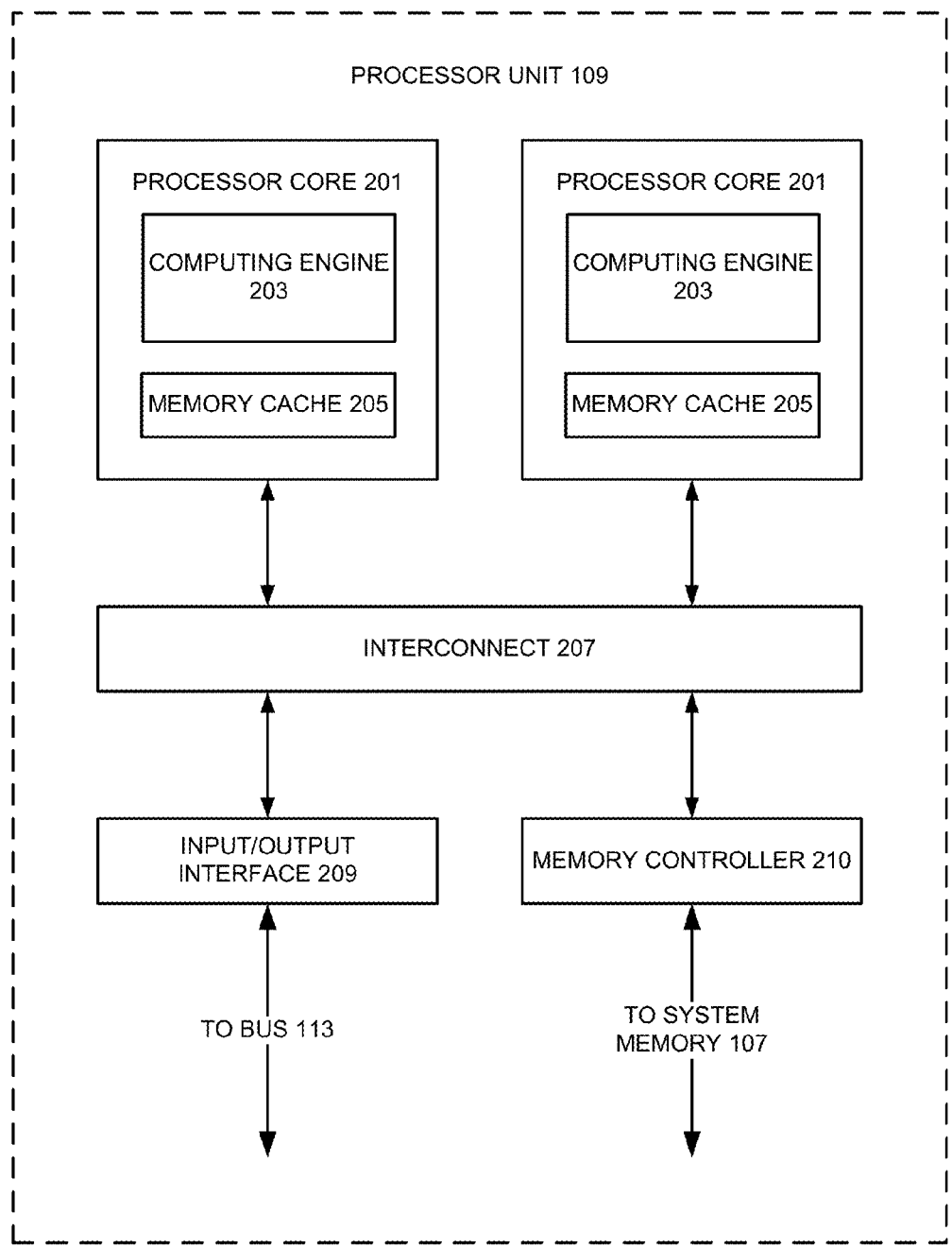
FIG. 2 illustrates an example of a multi-core processor unit that may be used to implement various embodiments of the invention.
Figure 3A:
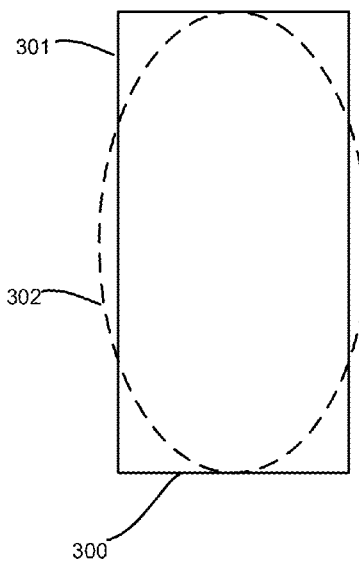
FIG. 3A illustrates a mask feature 300 and a simulated image of the mask feature.
Figure 3C:
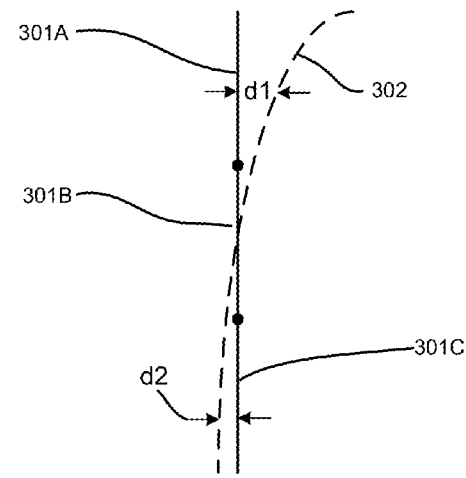
FIG. 3C illustrates edge displacement errors for some of the edge fragments.
Figure 3B:
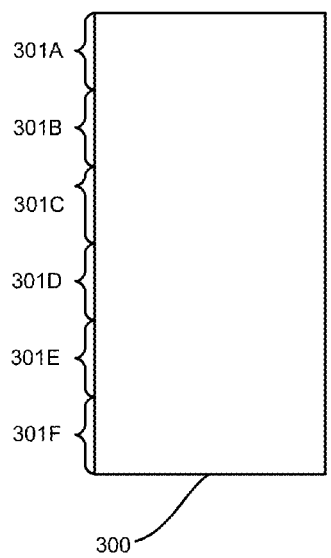
FIG. 3B illustrates an example of fragmentation of an edge of the mask feature 300.
Figure 3D:
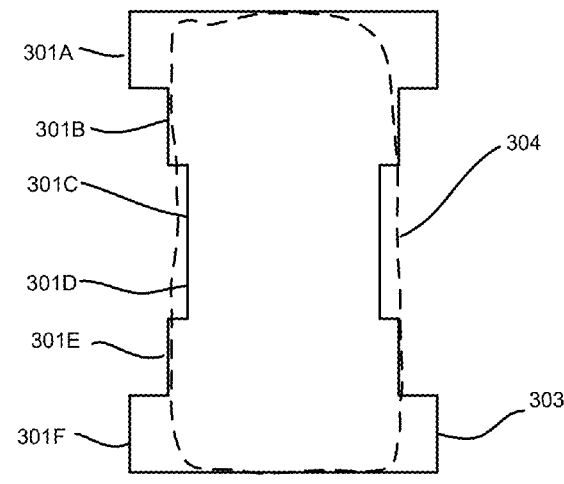
FIG. 3D illustrates a mask feature modified from the mask feature 300 by an OPC process and a corresponding simulated image.

With some implementations of the disclosed technology, the master computing device 103 may employ one or more processing units 111 having more than one processor core. Accordingly, FIG. 2 illustrates an example of a multi-core processor unit 111 that may be employed with various embodiments of the disclosed technology. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the disclosed technology, the processor units 111 may include additional components, such as a high-level cache memory accessible shared by the processor cores 201.

While FIG. 2 shows one illustration of a processor unit 111 that may be employed by some embodiments of the disclosed technology, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the disclosed technology may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117*x* through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the disclosed technology, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the disclosed technology may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the disclosed technology, either the computer 103, one or more of the servant computers 117, or some combination of both may use two or more different interface devices 113 or 123 for communicating over multiple communication interfaces.

With various examples of the disclosed technology, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the disclosed technology, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the disclosed technology.

Retargeting Tool

Figure 4:
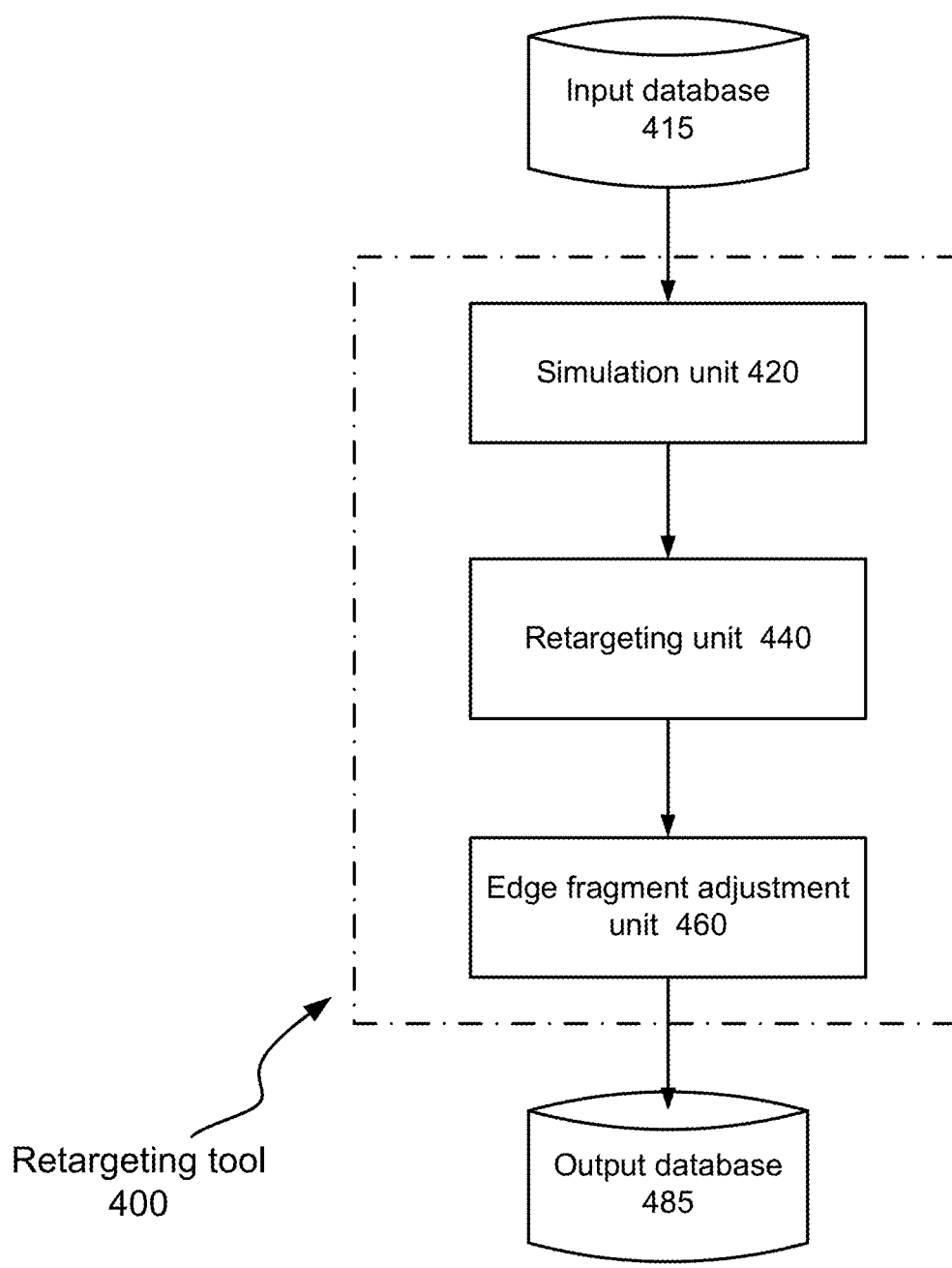
FIG. 4 illustrates an example of a retargeting tool.

FIG. 4 illustrates an example of a retargeting tool 400 that may be implemented according to various embodiments of the disclosed technology. As seen in the figure, the retargeting tool 400 includes a simulation unit 420, a retargeting unit 440, and an edge fragment adjustment unit 460. As also shown in this figure, various implementations of the retargeting tool 400 may cooperate with (or incorporate, in whole or part) an input database 415 and an output database 485.

As will be discussed in more detail below, the simulation unit 420 receives layout data from the input database 415 and performs process window simulations to generate process window information. The retargeting unit 440 determines retargeted print positions for a plurality of edge fragments in the layout design simultaneously based on the process window information. The edge fragment adjustment unit 460 adjusts positions of the plurality of edge fragments for optical proximity correction based on the retargeted print positions. The adjusted edge fragment positions are outputted to the output database 485.

As previously noted, various embodiments of the disclosed technology may be embodied by a computing system, such as the computing system illustrated in FIG. 1 and FIG. 2. Accordingly, one or more of the simulation unit 420, the retargeting unit 440, and the edge fragment adjustment unit 460 are implemented by one or more computing systems, such as the computing system illustrated in FIGS. 1 and 2, executing programmable instructions. Correspondingly, some other embodiments of the disclosed technology may be implemented by software-executable instructions, stored on a non-transitory computer-readable medium, for instructing a computing system to perform functions of one or more of the simulation unit 420, the retargeting unit 440, and the edge fragment adjustment unit 460. Further, each unit may either be fully automated or allow a user to provide instructions for an operation. As used herein, the term "non-transitory computer-readable medium" refers to computer-readable medium that are capable of storing data for future retrieval, and not for propagating electro-magnetic waves. The non-transitory computer-readable medium may be, for example, a magnetic storage device, an optical storage device, a "punched" surface type device, or a solid state storage device.

It should be appreciated that, while the simulation unit 420, the retargeting unit 440, and the edge fragment adjustment unit 460 are shown as separate units in FIG. 4, a single servant computer (or a single processor within a master computer) may be used to implement two or more of these units at different times, or components of two or more of these units at different times.

With various examples of the disclosed technology, the input database 415 and the output database 485 may be implemented using any suitable computer readable storage device. That is, either of the input database 415 and the output database 485 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. While the input database 415 and the output database 485 are shown as separate units in FIG. 4, a single data storage device may be used to implement some or all of these databases.

Retargeting Based on Process Window Simulations

Figure 5:
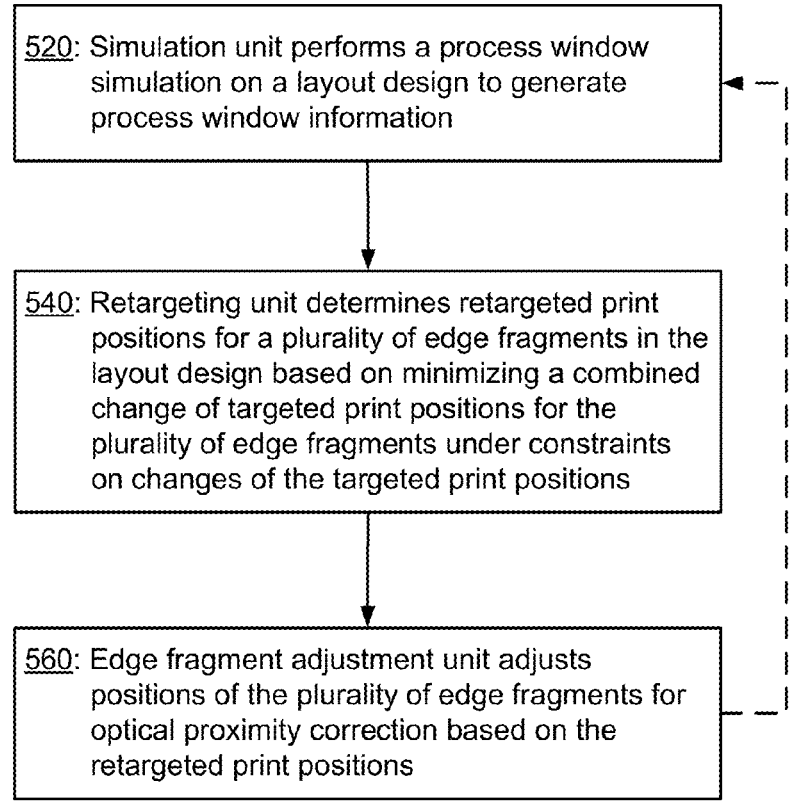
FIG. 5 illustrates a flowchart describing methods of retargeting according to various embodiments of the disclosed technology.

FIG. 5 illustrates a flowchart describing methods of retargeting according to various embodiments of the disclosed technology. For purposes of explanation, various methods encompassed in FIG. 5 will be described with reference to the retargeting tool 400 discussed earlier. It should be appreciated that the operations illustrated in FIG. 5 may be employed by implementations of a different retargeting tool, according to various embodiments of the disclosed technology. Likewise, it should be appreciated that the retargeting tool 400 shown in FIG. 4 or in other configurations may be used to perform methods according to various embodiments of the disclosed technology different from those encompassed by the flowchart of FIG. 5.

Also, it should be appreciated that various embodiments of the disclosed technology may be implemented by a system comprising one or more processors programmed to perform the operations described in FIG. 5. Still further, various embodiments of the disclosed technology may be implemented by processor-executable instructions, stored in a processor-readable medium, for causing one or more processors to perform the operations described in FIG. 5.

The flow illustrated in FIG. 5 starts with operation 520, the simulation unit 420 performs a process window simulation on a layout design to generate process window information. The layout design corresponds to at least a portion of an integrated circuit. The process window information comprises predicted print positions of layout features computed under various process conditions.

Figure 6:
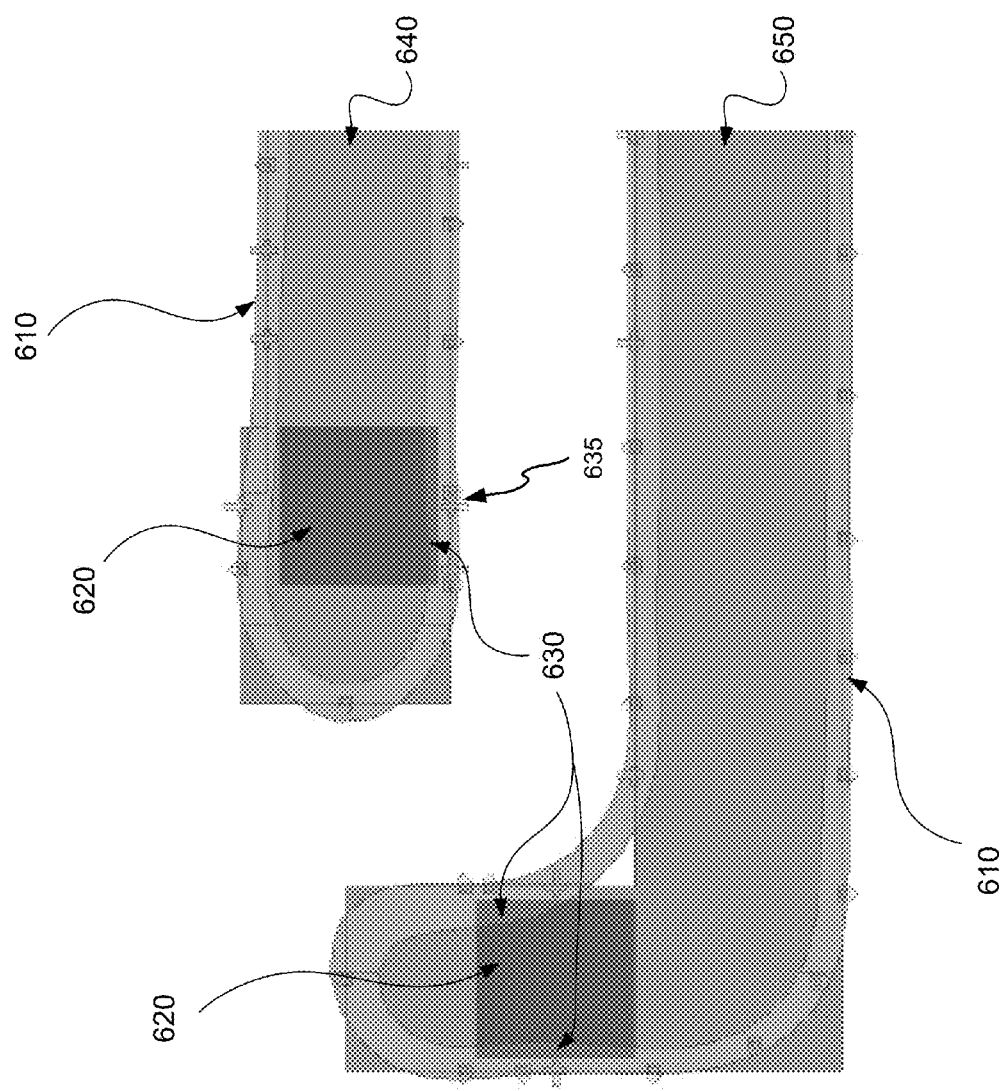
FIG. 6 illustrates a PV band for two polygons in a layout region.

With various implementations of the disclosed technology, a PV band and/or print images for individual layout features derived under user-specified process conditions may be generated for the layout design. FIG. 6 illustrates a PV band 610 for two polygons 640 and 650 in a layout region. The two squares 620 show contacts from an enclosure layer that should be covered by the polygons 640 and 650. However, the PV band 510 overlaps portions of the squares 620 as shown in FIG. 6. The overlapped regions 630 suggest the existence of enclosure hotspots. Pinching problems can be seen in FIG. 6 as well especially near the line ends as the linewidth for both polygons 640 and 650 measured from the inside boundary of the PV band is much narrower than the targeted. Litho hotspots such as the ones shown in FIG. 6 may be eliminated by retargeting portions of layout features. To generate PV bands or, the simulation unit 420 can adopt a commercial process window simulation tool, such as those in the Calibre family of software tools available from Mentor Graphics Corporation, Wilsonville, Oreg.

In operation 540, the retargeting unit 440 determines retargeted print positions for a plurality of edge fragments in the layout design based on minimizing a combined change of targeted print positions for the plurality of edge fragments under constraints on changes of the targeted print positions for the plurality of edge fragments. The constraints are represented based on the process window information and specification limits for printed layout features.

Retargeting one edge fragment may eliminate one hotspot problem associated with the edge fragment, but may create a new hotspot or make another existing hotspot worse. For example, while moving down edge fragment(s) near region 635 in FIG. 6 solves the enclosure hotspot for the polygon 640, this retargeting may create a bridging hotspot between polygons 640 and 650. The retargeting unit 440 solves this problem by retargeting neighboring edge fragments simultaneously. Constraints on a plurality of edge fragments are considered and changes of the targeted print positions for the plurality of edge fragments are optimized to achieve a minimized combined change. The combined change may be a linear combination of the changes of the targeted positions for the plurality of edge fragments. In some embodiments of the disclosed technology, the linear combination of the changes of the targeted positions is simply a sum of the absolute values of the changes of the targeted print positions.

With various implementations of the disclosed technology, the retargeting unit 440 may employ the linear programming technique for determining retargeted print positions. The objective function for linear programming is a linear combination of the changes of the targeted positions (or retargeting values):

$$c^T x \tag{1}$$

where x represents the vector of retargeting values for the plurality of edge fragments ($x_i$ is measured along normal direction from the original target position of the edge segment i), c is a vector of coefficients, and $(.)^T$ is the matrix transpose. With some implementations of the disclosed technology, the x is replaced by $|x|$, of which components are $|x_i|$. A simple sum of the absolute retargeted values may be used by setting each component of c as "1".

The constraints for linear programming are formulated based on the constraints on changes of the targeted print positions for the plurality of edge fragments. The constraints may be represented based on the process window information and specification limits for printed layout features. For an edge fragment, examples of the specification limits are:

1) inner and outer limits of nominal EPE;
2) minimum spacing between the edge fragment and a neighboring edge fragment;
3) minimum width between the edge fragment and a neighboring edge fragment; and
4) minimum enclosure specification limit.

where the width, spacing and enclosure are measured across process conditions (PV band or user-specified process conditions for individual layout features).

The above constraints may be expressed as:

$$\text{inner\_limit}-\text{nominal EPE} \leq x_i \leq \text{outer\_limit}-\text{nominal EPE}$$

$$a_i x_i + a_j x_j \geq -\text{width\_pw\_measured}(i,j) + \text{width\_pw\_spec}(i,j)$$

$$a_i x_i + a_j x_j \geq \text{spacing\_pw\_measured}(i,j) - \text{spacing\_pw\_spec}(i,j) \quad (2)$$

$$x_i \geq -\text{enclsoure\_measured}(i) + \text{enclosure\_spec}(i) \quad (2)$$

where $a_i$ and $a_j$ are coefficients that may take into account the differences between process window EPE change rates and nominal EPE change rates for individual edge fragments. These coefficients can be estimated with correction history of fragments or with mask error enhancement factor (MEEF)-based calculation. For each edge segment i, the constraint may include one or more of the above, and/or constraints not listed. The matrix form of Eq. (2) is:

$$d \geq Ax \geq b \quad (3)$$

Because only neighboring edge fragments tend to be connected by spacing/width/enclosure constraints, the matrix A is usually a sparse matrix.

To solve the linear programming problem represented by Eqs. (1) and (3), the retargeting unit 440 may employ an open-source solver such as CLP (COIN-OR LP). A description of the software can be found in T. Ralphs, "An Introduction to the COIN-OR Optimization Suite: Open Source Tools for Building and Solving Optimization Models", Optimization Days, Montreal, May 7, 2013.

In operation 560, the edge fragment adjustment unit adjusts positions of the plurality edge fragments for optical proximity correction based on the retargeted print positions. EPEs may be computed according to the retargeted print positions. The adjustment amount for a particular edge fragment may be derived by multiplying the corresponding EPE by a feedback factor or by using the cross-MEEF-based methods.

The above described retargeting process may be repeated for multiple times until one or more predetermined conditions are met. This process may also be combined with an OPC process. Some or all of conventional OPC iteration steps may incorporate the above process. In some embodiments of the disclosed technology, conventional OPC may be performed for a few iterations first before introducing the retargeting. In some other embodiments of the disclosed technology, conventional OPC and the retargeting one may be performed in alternate iterations. The retargeting process may also be limited to one or more regions of the layout design. The one or more regions may be specified by users or selected based on predetermined criteria.

Conclusion

While the disclosed technology has been described with respect to specific examples including presently preferred modes of carrying out the disclosed technology, those skilled in the art will appreciate that there are numerous variations and permutations of the above described systems and techniques that fall within the spirit and scope of the disclosed technology as set forth in the appended claims. For example, while specific terminology has been employed above to refer to electronic design automation processes, it should be appreciated that various examples of the invention may be implemented using any desired combination of electronic design automation processes.

What is claimed is:

1. One or more non-transitory computer-readable media storing computer-executable instructions which, when executed, cause one or more processors to perform a method, the method comprising:

performing a process window simulation on a layout design to generate process window information, the layout design corresponding to at least a portion of an integrated circuit, and the process window information comprising predicted print positions of layout features computed under various process conditions;

determining retargeted print positions for a plurality of edge fragments in the layout design based on minimizing a combined change of targeted print positions for the plurality of edge fragments under constraints on changes of the targeted print positions for the plurality of edge fragments, the constraints being represented based on the process window information and specification limits for printed layout features;

determining edge placement errors of the plurality of edge fragments based on the retargeted print positions;

determining adjustment amounts of the plurality of edge fragments based on the edge placement errors;

adjusting positions of the plurality of edge fragments by the adjustment amounts; and performing optical proximity correction using the adjusted positions of the plurality of edge fragments and the retargeted print positions.

2. The one or more non-transitory computer-readable media recited in claim 1, wherein the method further comprises:

repeating the performing, the determining, and the adjusting.

3. The one or more non-transitory computer-readable media recited in claim 1, wherein the combined change of targeted positions is a linear combination of, the changes of or a linear combination of absolute values of the changes of, the targeted print positions for the plurality of edge fragments.

4. The one or more non-transitory computer-readable media recited in claim 3, wherein the linear combination of the absolute values of the changes is a sum of the absolute values of the changes of the targeted print positions.

5. The one or more non-transitory computer-readable media recited in claim 1, wherein the determining employs a linear programming method.

6. The one or more non-transitory computer-readable media recited in claim 1, wherein the process window information comprises a PV (process variability) band, print images for individual layout features derived under user-specified process conditions, or both.

7. The one or more non-transitory computer-readable media recited in claim 1, wherein the specification limits comprise specification limits on line width, line spacing, enclosure, or any combination thereof.

8. A method, comprising:

performing a process window simulation on a layout design to generate process window information, the layout design corresponding to at least a portion of an integrated circuit, and the process window information comprising predicted print positions of layout features computed under various process conditions;

determining retargeted print positions for a plurality of edge fragments in the layout design based on minimizing a combined change of targeted print positions for the plurality of edge fragments under constraints on changes of the targeted print positions for the plurality of edge fragments, the constraints being represented based on the process window information and specification limits for printed layout features;

determining edge placement errors of the plurality of edge fragments based on the retargeted print positions;

determining adjustment amounts of the plurality of edge fragments based on the edge placement errors;

adjusting positions of the plurality of edge fragments by the adjustment amounts; and performing optical proximity correction using the adjusted positions of the plurality of edge fragments and the retargeted print positions.

9. The method recited in claim 8, further comprising:
repeating the performing, the determining, and the adjusting.

10. The method recited in claim 8, wherein the combined change of targeted positions is a linear combination of the changes of, or a linear combination of absolute values of, the changes of the targeted print positions for the plurality of edge fragments.

11. The method recited in claim 10, wherein the linear combination of the absolute values of the changes is a sum of the absolute values of the changes of the targeted print positions.

12. The method recited in claim 8, wherein the determining employs a linear programming method.

13. The method recited in claim 8, wherein the process window information comprises a PV (process variability) band, print images for individual layout features derived under user-specified process conditions, or both.

14. The method recited in claim 8, wherein the specification limits comprise specification limits on line width, line spacing, enclosure, or any combination thereof.

15. A system comprising:
one or more processors, the one or more processors programmed to perform a method, the method comprising:
performing a process window simulation on a layout design to generate process window information, the layout design corresponding to at least a portion of an integrated circuit, and the process window information comprising predicted print positions of layout features computed under various process conditions;

determining retargeted print positions for a plurality of edge fragments in the layout design based on minimizing a combined change of targeted print positions for the plurality of edge fragments under constraints on changes of the targeted print positions for the plurality of edge fragments, the constraints being represented based on the process window information and specification limits for printed layout features;

determining edge placement errors of the plurality of edge fragments based on the retargeted print positions;

determining adjustment amounts of the plurality of edge fragments based on the edge placement errors;

adjusting positions of the plurality of edge fragments by the adjustment amounts; and performing optical proximity correction using the adjusted positions of the plurality of edge fragments and the retargeted print positions.

16. The system recited in claim 15, wherein the method further comprises:
repeating the performing, the determining, and the adjusting.

17. The system recited in claim 15, wherein the combined change of targeted positions is a linear combination of the changes of, or a linear combination of absolute values of the changes of, the targeted print positions for the plurality of edge fragments.

18. The system recited in claim 17, wherein the linear combination of the absolute values of the changes is a sum of the absolute values of the changes of the targeted print positions.

19. The system recited in claim 15, wherein the determining employs a linear programming method.

20. The system recited in claim 15, wherein the process window information comprises a PV (process variability) band, print images for individual layout features derived under user-specified process conditions, or both.

* * * * *